(12) United States Patent
Hable et al.

(10) Patent No.: US 10,128,165 B2
(45) Date of Patent: Nov. 13, 2018

(54) PACKAGE WITH VERTICALLY SPACED PARTIALLY ENCAPSULATED CONTACT STRUCTURES

(71) Applicant: Infineon Technologies AG, Neubiberg (DE)

(72) Inventors: Wolfram Hable, Neumarkt (DE); Andreas Grassmann, Regensburg (DE); Juergen Hoegerl, Regensburg (DE); Eduard Knauer, Regensburg (DE); Michael Ledutke, Saal (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/796,771

(22) Filed: Oct. 28, 2017

(65) Prior Publication Data
US 2018/0122720 A1    May 3, 2018

(30) Foreign Application Priority Data

Oct. 31, 2016    (DE) .................. 10 2016 120 778

(51) Int. Cl.
*H01L 23/28* (2006.01)
*H01L 23/367* (2006.01)
(Continued)

(52) U.S. Cl.
CPC ...... *H01L 23/3675* (2013.01); *H01L 21/4853* (2013.01); *H01L 21/4882* (2013.01);
(Continued)

(58) Field of Classification Search
CPC . H01L 2924/00014; H01L 2924/13055; H01L 2924/1305; H01L 2924/181;
(Continued)

(56) References Cited

U.S. PATENT DOCUMENTS 6,885,096 B2 * 4/2005 Hirahara ............... H01L 25/071
257/666
8,654,554 B2 * 2/2014 Seki ........................ H01L 24/32
361/688

(Continued)

FOREIGN PATENT DOCUMENTS

DE          10303103 A1    8/2004
DE       102012222879 A1   7/2013
(Continued)

*Primary Examiner* — Jaehwan Oh (57) ABSTRACT

A package comprising at least one electronic chip, an encapsulant encapsulating at least part of the at least one electronic chip, a first electrically conductive contact structure extending partially within and partially outside of the encapsulant and being electrically coupled with at least one first terminal of at least one of the at least one electronic chip, and a second electrically conductive contact structure extending partially within and partially outside of the encapsulant and being electrically coupled with at least one second terminal of at least one of the at least one electronic chip, wherein at least a portion of the first electrically conductive contact structure and at least a portion of the second electrically conductive contact structure within the encapsulant are spaced in a direction between two opposing main surfaces of the package.

25 Claims, 5 Drawing Sheets

(51) Int. Cl.
  *H01L 21/48* (2006.01)
  *H01L 21/56* (2006.01)
  *H01L 23/31* (2006.01)
  *H01L 23/373* (2006.01)
  *H01L 23/498* (2006.01)
  *H01L 23/00* (2006.01)
  *H01L 25/07* (2006.01)
  *H01L 25/18* (2006.01)
  *H01L 25/00* (2006.01)
  *B60L 11/18* (2006.01)
  *H02M 7/00* (2006.01)

(52) U.S. Cl.
  CPC ........ *H01L 21/565* (2013.01); *H01L 23/3114* (2013.01); *H01L 23/3121* (2013.01); *H01L 23/3735* (2013.01); *H01L 23/49811* (2013.01); *H01L 23/49861* (2013.01); *H01L 24/48* (2013.01); *H01L 25/072* (2013.01); *H01L 25/18* (2013.01); *H01L 25/50* (2013.01); *B60L 11/18* (2013.01); *H01L 2224/4823* (2013.01); *H01L 2924/1033* (2013.01); *H01L 2924/10272* (2013.01); *H01L 2924/1203* (2013.01); *H01L 2924/13055* (2013.01); *H01L 2924/14252* (2013.01); *H01L 2924/30107* (2013.01); *H02M 7/003* (2013.01)

(58) Field of Classification Search
  CPC ............... H01L 25/072; H01L 2924/00; H01L 2924/00012; H01L 2224/48091
  See application file for complete search history.

(56) References Cited

U.S. PATENT DOCUMENTS

| | | | |
|---|---|---|---|
| 2007/0145540 A1* | 6/2007 | Mochida | H01L 23/4334 257/659 |
| 2012/0307541 A1* | 12/2012 | Shimoike | H01L 24/29 363/132 |

FOREIGN PATENT DOCUMENTS

| | | |
|---|---|---|
| DE | 102012211424 B4 | 5/2014 |
| DE | 112012005226 T5 | 9/2014 |
| DE | 112013003222 T5 | 3/2015 |
| DE | 112013004311 T5 | 5/2015 |
| DE | 112014004242 T5 | 6/2016 |
| EP | 2416483 A2 | 2/2012 |
| EP | 2565918 A1 | 3/2013 |
| EP | 2590213 A1 | 5/2013 |
| EP | 2682985 A1 | 1/2014 |
| EP | 2728615 A1 | 5/2014 |
| EP | 2763165 A1 | 8/2014 |
| JP | 2006222149 A | 8/2006 |
| JP | 2010035369 A | 2/2010 |
| JP | 2010157565 A | 7/2010 |
| WO | 2015162856 A1 | 10/2015 |

* cited by examiner

PACKAGE WITH VERTICALLY SPACED PARTIALLY ENCAPSULATED CONTACT STRUCTURES

BACKGROUND OF THE INVENTION

Field of the Invention

The present invention relates to packages, to a vehicle, to a method of use, and to methods of manufacturing a package.

Description of the Related Art

A power module, for instance for automotive applications, provides a physical containment for power components, usually power semiconductor devices in form of electronic chips comprising one or more integrated circuit components. Examples of integrated circuit components of power modules are an insulated-gate bipolar transistor (IGBT), and a diode.

For packages with electronic functionality, in particular in case of a converter circuit implemented into such a package, it is desired that a high switching velocity is combined with a low switching loss. This is however difficult to achieve with conventional approaches.

SUMMARY OF THE INVENTION

There may be a need for a package allowing for an operation with high electronic performance and low loss.

According to an exemplary embodiment, a package is provided which comprises at least one electronic chip, an encapsulant encapsulating at least part of the at least one electronic chip, a first electrically conductive contact structure extending partially within and partially outside of the encapsulant and being electrically coupled with at least one first terminal (such as a first chip pad) of at least one of the at least one electronic chip, and a second electrically conductive contact structure extending partially within and partially outside of the encapsulant and being electrically coupled with at least one second terminal (such as a second chip pad) of at least one of the at least one electronic chip, wherein at least a portion of the first electrically conductive contact structure and at least a portion of the second electrically conductive contact structure are spaced within the encapsulant in a direction between two opposing main surfaces (which may be aligned parallel to one another) of the package.

According to another exemplary embodiment, a power package is provided which comprises a plurality of semiconductor power chips (which may be electrically interconnected), an encapsulant encapsulating at least part of each of the plurality of semiconductor power chips, a first electrically conductive contact structure extending partially within and partially outside of the encapsulant and being electrically coupled with at least one first terminal of at least one of the plurality of semiconductor power chips, a second electrically conductive contact structure extending partially within and partially outside of the encapsulant and being electrically coupled with at least one second terminal of at least one of the plurality of semiconductor power chips, wherein at least a portion of the first electrically conductive contact structure (in particular within the encapsulant) and at least a portion of the second electrically conductive contact structure (in particular within the encapsulant) are vertically spaced and electrically decoupled from one another (wherein a horizontal direction may correspond to opposing main surfaces of the package).

According to still another exemplary embodiment, a vehicle is provided which comprises one of the packages having the above mentioned features.

According to yet another exemplary embodiment, a method of manufacturing a package is provided, wherein the method comprises encapsulating at least part of at least one electronic chip with an encapsulant, providing a first electrically conductive contact structure extending partially within and partially outside of the encapsulant and being electrically coupled with at least one first terminal of at least one of the at least one electronic chip, providing a second electrically conductive contact structure extending partially within and partially outside of the encapsulant and being electrically coupled with at least one second terminal of at least one of the at least one electronic chip, and spacing at least a portion of the first electrically conductive contact structure and at least a portion of the second electrically conductive contact structure within the encapsulant from one another in a direction extending between two opposing main surfaces of the package.

According to yet another exemplary embodiment, a method of manufacturing a power package is provided which comprises encapsulating at least part of each of a plurality of semiconductor power chips by an encapsulant, providing a first electrically conductive contact structure extending partially within and partially outside of the encapsulant and being electrically coupled with at least one first terminal of at least one of the plurality of semiconductor power chips, providing a second electrically conductive contact structure extending partially within and partially outside of the encapsulant and being electrically coupled with at least one second terminal of at least one of the plurality of semiconductor power chips, and electrically decoupling the first electrically conductive contact structure from the second electrically conductive contact structure by vertically spacing at least portions of them within the encapsulant.

According to yet another exemplary embodiment, one of the packages having the above mentioned features is used for an automotive application.

According to an exemplary embodiment of the invention, a package or module is provided which allows to obtain a low inductance of leads of electrically conductive contact structures of the module guiding signals and/or power between an interior and an exterior of the package. In order to accomplish this, the package has two electrically conductive contact structures which, at least in encapsulated portions thereof, are arranged with a vertical gap in between rather than being all arranged laterally next to one another. Hence, leads of electrically conductive contact structures of such a package may be vertically spaced which has turned out as an efficient measure for reducing the parasitic inductance formed by the electrically conductive contact structures. With such a low inductance configuration, it becomes possible to switch the one or more electronic chips integrated within such a package with a faster velocity while keeping losses during such switching operations and caused by the parasitic inductance low.

By vertically spacing encapsulated sections of two electrically conductive contact structures (in particular corresponding portions relating to power pins) with a reliable dielectric decoupling but preferably a small distance, a very small parasitic inductance of the electrically conductive contact structures may be obtained. As a consequence, high-voltage peaks during switching of one or more electronic chips of the package can be safely prevented, thereby improving electrical reliability and integrity of the package. This also allows to increase the switching speed, thereby increasing the electric performance.

More specifically, such an architecture of the electrically conductive contact structures (such as leadframes) is of particular advantage when the package or power module is embodied as inverter or for another automotive power application, because here the disturbing influence of parasitic inductances contributed by the electrically conductive contact structures is particularly high.

DESCRIPTION OF FURTHER EXEMPLARY EMBODIMENTS

In the following, further exemplary embodiments of the packages, the vehicle, and the methods will be explained.

In an embodiment, the first electrically conductive contact structure comprises at least one signal pin and/or at least one first supply pin. In this context, the term "signal pins" denotes pins of the respective electrically conductive contact structure via which signals are guided between an interior and an exterior of the package. In contrast to this, the one or more supply pins of the first electrically conductive contact structure may provide certain electric potentials (such as a plus or positive potential, a minus or negative potential) to the one or more encapsulated electronic chips. For instance, signal pins may have a substantially circular or square cross section. Hence, a signal pin may form a wire-like or filament-like structure. In contrast to this, power pins may have a rectangular cross section, wherein the rectangle may have sides of significantly different lengths (for instance with a length ratio of at least three). Hence, a power pin may form a strip-like structure. In particular power pins are prone to introduce a significant parasitic capacitance, so that their vertical spacing provides particularly pronounced advantages.

In an embodiment, the second electrically conductive contact structure comprises at least one second supply pin. As mentioned above, the supply pins may supply a defined electric potential (such as a plus potential, a minus potential, etc.) to the one or more electronic or semiconductor chips, wherein such a potential may also serve as an energy supply for operating the one or more electronic chips.

In an embodiment, the at least one first supply pin and the at least one second supply pin extend at least partly in different planes between two opposing main surfaces of the package. Therefore, at least portions of the first and second supply pins may relate to different, and preferably (but not necessarily) parallel, planes which reduces the parasitic inductance and therefore contributes to a low loss operation even in the presence of a fast switching operation.

In an embodiment, the at least one first supply pin comprises a positive potential pin and the at least one second supply pin comprises a negative potential pin. The positive potential pin and the negative potential pin may be neighboured or positioned next to one another. Hence, in particular the two supply pins with the largest difference in terms of electric potential may be vertically spaced for efficiently suppressing parasitic inductance based artefacts.

In an embodiment, the at least one first supply pin additionally comprises a phase pin, in particular extending in the same plane as the positive potential pin. Thus, the phase plane and the positive potential plane (or alternatively the phase plane and the negative potential plane) may be coplanar, whereas the respectively other charged supply pin (i.e. the supply pin carrying a negative potential or a positive potential) may be arranged at least partly in a different separate plane.

In an embodiment, the at least one signal pin has a smaller dimension (in particular a smaller cross sectional area) than the at least one first supply pin. By configuring the (in many cases large plurality of) signal pins with a small extension, and configuring only the (in many cases only few) supply pin(s) with larger dimensions, a compact package with proper electronic functionality may be obtained.

In an embodiment, the at least one signal pin extends out of the encapsulant along a first direction differing from a second direction along which the at least one first supply pin extends out of the encapsulant. By taking this measure, more than one lateral surface of the package may be used for guiding out the respective pin(s) of the respective electrically conductive contact structure out of the package. This results in a compact configuration and intuitively spatially separates the signal pins from the supply pins. However, alternatively, it is also possible that for instance one supply pin extends out of the encapsulant along the first direction.

In an embodiment, at least a portion of the first electrically conductive contact structure and at least a portion of the second electrically conductive contact structure extend in parallel to one another. Such a parallel alignment keeps the distance between the respective portions of the electrically conductive contact structures spatially constant and therefore avoids local weak points in terms of parasitic inductance and undesired electric interactions between the different lines or leads. Also in terms of manufacturability, the parallel alignment results in a simply produceable architecture.

In an embodiment, the encapsulant comprises a main body and an extension being narrower than the main body, wherein the first electrically conductive contact structure and the second electrically conductive contact structure extend partly through the extension and may be electrically decoupled from one another by electrically insulating material of the extension of the encapsulant. Main body and extension may form an integral structure (for instance may be formed simultaneously by molding using a correspondingly shaped mold tool). By simply extending the encapsulant, in particular a mold compound, with regard to a substantially cuboid portion of the package, the parallel extending portions of the different electrically conductive contact structures may be reliably electrically insulated by dielectric material of the encapsulant. This is a simple and efficient measure, not requiring any additional manufacturing procedure, of ensuring electric isolation between the vertically spaced electrically conductive contact structures.

In an embodiment, the package comprises a dielectric layer (such as an electrically insulating foil) between a portion of the first electrically conductive contact structure and a portion of the second electrically conductive contact structure (in particular being located outside of and/or inside the encapsulant) for electrically decoupling the first electrically conductive contact structure and the second electrically conductive contact structure from one another. Additionally or alternatively to the provision of an extension of the encapsulant, electric isolation between the two vertically spaced electrically conductive contact structures may be also accomplished or enhanced by sandwiching a dielectric foil (for instance a layer of polyimide or Kapton®) between the electrically conductive contact structures. Interposing such a dielectric foil may be carried out when placing the various components of the package in a mold tool for subsequent encapsulation by molding. Advantageously, the dielectric layer may have two opposing adhesive main surfaces, so that the dielectric layer properly adheres to both the first electrically conductive contact structure and the second electrically conductive contact structure.

In an embodiment, the package comprises a chip carrier on which the at least one electronic chip is mounted. It is also possible that more than one chip carrier is provided in the package and/or that more than one electronic chip is mounted on one and the same chip carrier. For example, the at least one electronic chip may be mechanically and/or electrically connected on the chip carrier, for instance by soldering, sintering, adhering, etc. At least part of the chip carrier may also be embodied as part of one of the electrically conductive contact structures.

In an embodiment, the package comprises electric connection elements, in particular at least one of the group consisting of bond wires, bond ribbons and solder structures, electrically connecting the chip carrier with the first electrically conductive contact structure and the second electrically conductive contact structure. For example, such electric connection elements may be made of aluminum or copper. For the relatively small signal pins, the connection may be accomplished by wire bonding, whereas the larger supply pins may be connected by bond ribbons. In one embodiment, a first procedure of electrically contacting by forming the electric connection elements may be accomplished upon providing the (in particular lower) first electrically conductive contact structure, whereas upon subsequent provision of the (in particular higher) second electrically conductive contact structure, additional electric connection elements may be formed later.

In an embodiment, at least one other portion (in particular an exposed end portion) of the second electrically conductive contact structure extends in the same plane as at least one other portion (in particular an exposed end portion) of the first electrically conductive contact structure. In other words, at least another portion of the first electrically conductive contact structure and at least another portion of the second electrically conductive contact structure outside of the encapsulant may be coplanar. This ensures a compact design. By guiding exposed end portions of the second electrically conductive contact structure back into the plane in which the (in particular in which the entire) first electrically conductive contact structure extends, the external appearance—and in particular the geometrical arrangement of the electric contacts—of the package or module does not change compared to conventional packages. Only in an interior of the encapsulant, the arrangement in parallel vertically spaced planes then occurs. Consequently, the package may be structurally or geometrically compatible with existing connection technologies for such packages, so that no adaptation of electronic periphery devices is required to be compatible with a package according to an exemplary embodiment.

In an embodiment, the package is configured as a converter, in particular a DC-DC converter. Such a converter may be configured for converting a battery voltage into a supply voltage for an electric engine, or in opposite direction. Therefore, high switching velocities occurring in such an inverter may conventionally result in losses at a consequence of parasitic inductances contributed by leads of the electrically conductive contact structures. Thus, a low loss and high velocity operation of the inverter package becomes possible with the vertical spacing and preferably parallel arrangement of sections of the two electrically conductive contact structures in the package architecture according to exemplary embodiments of the invention.

In an embodiment, at least one of the first electrically conductive contact structure and of the second electrically conductive contact structure comprises a strip-shaped pin (in particular a strip-shaped power pin). The long sides of the strips may be arranged in parallel and in different planes to keep the inductance small.

In an embodiment, a vertical distance between the portions of the first electrically conductive contact structure and of the second electrically conductive contact structure within the encapsulant is less than 1000 µm, in particular is in a range between 100 µm and 400 µm, more particularly is in a range between 200 µm and 300 µm. This ensures to obtain a high electronic performance and reliability and simultaneously keeps the vertical space consumption small and the parasitic inductance small. In particular, it is desired that the distance between the spaced sections of the electrically conductive contact structures within an encapsulant is small to keep the inductance small. Consequently, the package may be high voltage robust (for instance may be reliably operable with voltages of up to 1200 V) when the gap is in a range between 200 µm and 300 µm. However, at the same time, the electrically conductive contact structures should be configured so that they are capable of withstanding a high pressure (for instance of 5 MPa) which may be exerted during the encapsulation procedure, in particular molding procedure. Upon exertion of such a pressure, any undesired electric contact between the two separate electrically conductive contact structures should be avoided. Such an electric decoupling can be obtained by three dimensionally bending at least one of the two electrically conductive contact structures (compare FIG. 3). Also interposing a dielectric foil between the two electrically conductive contact structures may be advantageous in this respect. By taking these measures, it is possible to obtain a package appropriate for high speed switching applications (for instance involving frequencies of 100 kHz to 200 kHz).

In an embodiment, the first electrically conductive contact structure is entirely planar. Consequently, it may be manufactured with low effort, for instance as punched copper plate.

Figure 3:
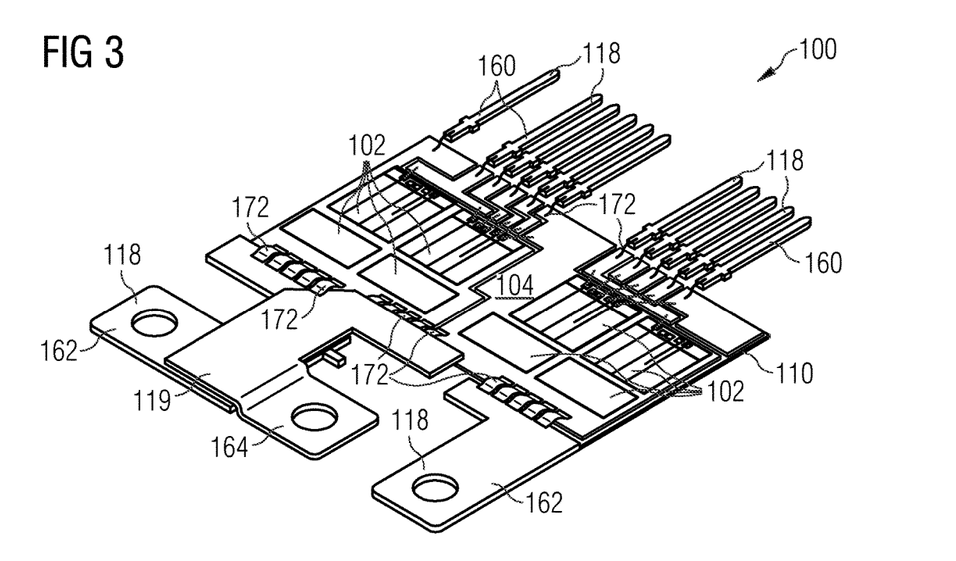
FIG. 3 shows a three-dimensional view of an interior of the power package according to FIG. 2.

In an embodiment, the second electrically conductive contact structure has different (in particular planar) sections extending in different planes (see for example the step-shaped geometry of the second electrically conductive contact structure according to FIG. 3). Consequently, it may be manufactured with low effort, for instance as punched and bent copper plate. Outside of the encapsulant, it may be coplanar with the first electrically conductive contact structure, while it may extend vertically spaced with regard to the first electrically conductive contact structure within the encapsulant.

In an embodiment, at least one of the first electrically conductive contact structure and the second electrically conductive contact structure extends out of the encapsulant at a lateral surface of the package between the two opposing main surfaces. The pins of the electrically conductive contact structures may extend partially or completely parallel to the (in particular horizontal) opposing main surfaces of the package. They may however leave the encapsulant at (in particular vertical) side walls or edges of the package.

In an embodiment, the package comprises a first heat removal body thermally coupled to a first main surface of the at least one electronic chip and configured for removing thermal energy from the at least one electronic chip, wherein the encapsulant encapsulates part of the first heat removal body. The first heat removal body may form part of one of the exterior main surfaces of the package. In an embodiment, the first heat removal body (and/or an optional second heat removal body) may comprise a material having a high thermal conductivity so as to be capable of efficiently removing heat from the one or more electronic chips to an environment of the package. In particular, the thermal conductivity of at least one of the heat removal bodies as a whole or a material thereof may be at least 10 W/mK, in particular at least 50 W/mK.

In an embodiment, the package comprises a second heat removal body thermally coupled to a second main surface of the at least one electronic chip or of at least one further electronic chip and configured for removing thermal energy from the at least one electronic chip or of the at least one further electronic chip, wherein the encapsulant encapsulates part of the second heat removal body. The second heat removal body may form part of one of the exterior main surfaces of the package. The encapsulant may encapsulate part (in particular only part) of the second heat removal body. The provision of two heat removal bodies allows for a double-sided cooling architecture (see for instance FIG. 1).

In an embodiment, the first heat removal body is configured as the above-mentioned chip carrier. In such a configuration, the first heat removal body may simultaneously serve for carrying the at least one electronic chip and for removing heat from the package, which heat is generated by the chip(s) during operation of the package.

In an embodiment, at least one of the first heat removal body and the second heat removal body comprises an electrically insulating (and preferably highly thermally conductive) layer having a first main surface covered by a first electrically conductive layer and having a second main surface covered by a second electrically conductive layer. For example, the electrically insulating layer may be simultaneously highly thermally conductive, which can be accomplished for example by the provision of a ceramic layer. At least one of the electrically conductive layers may be a copper layer combining a high thermal conductivity with a high electrical conductivity. However, aluminum is also a proper material selection for at least one of the electrically conductive layers. For instance, at least one of the first heat removal body and the second heat removal body may be configured as at least one of the group consisting of a Direct Copper Bonding substrate (DCB), and a Direct Aluminum Bonding substrate (DAB).

Alternative chip carriers which may be used for other embodiments can be any interposer like a substrate, a ceramic substrate, a laminar substrate, a leadframe, an IMS (Insulated Metal Substrate), a PCB (printed circuit board), etc.

In an embodiment, any of the electrically conductive contact structures may be embodied as a respective leadframe, extending partially within and partially outside (in particular forming one or more exposed leads or pins) of the encapsulant and being electrically coupled with the at least one electronic chip (for instance by wire bonding). By such an electrically conductive contact structure, the at least one electronic chip may be coupled to an electronic environment of the package. For this purpose, one or more legs of the electrically conductive contact structures may extend beyond the encapsulant. A leadframe may be a metal structure partially inside a chip package that is configured for carrying signals from the electronic chip to the outside, and/or vice versa. The electronic chip inside the package or electronic component may be attached to the leadframe, and then bond wires may be provided for attaching terminals or pads of the electronic chip to leads or pins of the leadframe. Subsequently, the leadframe may be molded in a plastic case or any other encapsulant.

In a preferred embodiment, the encapsulant is a mold compound. For the encapsulating by molding, a plastic material or a ceramic material may be used. The encapsulant may comprise an epoxy material. Filler particles (for instance $SiO_2$, $Al_2O_3$, $Si_3N_4$, BN, AlN, diamond, etc.), for instance for improving thermal conductivity may be embedded in an epoxy-based matrix of the encapsulant.

In an embodiment, the electronic chip is configured as a power semiconductor chip. Thus, the electronic chip (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on widebandgap semiconductors (such as silicon carbide, gallium nitride or gallium nitride on silicon). A semiconductor power chip may comprise one or more field effect transistors, diodes, inverter circuits, half-bridges, full-bridges, drivers, logic circuits, further devices, etc.

In an embodiment, the electronic chip experiences a vertical current flow. The package architecture according to exemplary embodiments of the invention is particularly appropriate for high power applications in which a vertical current flow is desired, i.e. a current flow in a direction perpendicular to the two opposing main surfaces of the electronic chip, one of which being used for mounting the electronic chip on the carrier.

In embodiments, the electronic component may be configured as a half bridge, a cascode circuit, a circuit constituted by a field effect transistor and a bipolar transistor being connected in parallel to one another, or a power semiconductor circuit. Therefore, the packaging architecture according to exemplary embodiments is compatible with the requirements of very different circuit concepts.

In an embodiment, the electronic component is configured as one the group consisting of a leadframe connected power module, a Transistor Outline (TO) electronic component, a Quad Flat No Leads Package (QFN) electronic component, a Small Outline (SO) electronic component, a Small Outline Transistor (SOT) electronic component, and a Thin More Outline Package (TSOP) electronic component. Therefore, the package according to an exemplary embodiment is fully compatible with standard packaging concepts (in particular fully compatible with standard TO packaging concepts) and appears externally as a conventional electronic component, which is highly user-convenient. In an embodiment, the package is configured as power module, e.g. molded power module. For instance, an exemplary embodiment of the electronic component may be an intelligent power module (IPM).

As substrate or wafer forming the basis of the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION OF EXEMPLARY EMBODIMENTS

The illustration in the drawing is schematically.

Before describing further exemplary embodiments in further detail, some basic considerations of the present inventors will be summarized based on which exemplary embodiments have been developed which provide for an electronically reliable package with low loss during operation.

According to an exemplary embodiment of the invention, a low inductance molded power module is provided.

A low inductance construction of an inverter package is of utmost importance for its use at higher switching velocity, in conjunction with lower switching losses and a resulting higher efficiency. This can be conventionally achieved only with high effort and only to a limited extent. Overvoltage and overload can be avoided by a reduction of the switching velocity. This however results in an increase of the switching loss within the electronic or semiconductor chips and is therefore not a realistic option. Conventionally, power pins of a molded module are guided out of the encapsulant within a common plane.

However, the design of the package influences strongly the switching characteristic of an inverter and other integrated circuit elements of the package, specifically the design of the connection pins. Exemplary embodiments provide a pin architecture resulting in a small parasitic inductance only. In the scenario of rapidly switching power packages, it is possible to design an electrically conductive connection structure of the package in a way that the parasitic inductance of the DC inputs are kept small or are even minimized. By taking this measure, voltage peaks during switching on and switching off the semiconductor chips and integrated circuit elements thereof may be kept small. This may safely prevent high load from impacting the package and its components. Moreover, deterioration or even damage of the one or more electronic chips resulting from effects caused by a high parasitic inductance may be safely prevented.

In order to overcome the above shortcomings, an exemplary embodiment of the invention guides the connection pins (in particular power pins such as a plus connection pin and a minus connection pin), which conventionally significantly contribute to the parasitic inductance, vertically spaced and parallel to one another out of the encapsulant.

In addition to a first leadframe (which may be an embodiment of a first electrically conductive contact structure of the package), which may guide all signal pins as well as a plus potential pin and a phase pin, it is possible to additionally place a further supply pin (for instance a minus potential pin) above the plus potential pin. This additional minus potential pin may form part of a second leadframe (which may be an embodiment of a second electrically conductive contact structure).

A desired electric isolation between the two electrically conductive contact structures may be accomplished by material of an encapsulant (in particular a mold compound such as an epoxy resin) upon encapsulating (in particular upon molding). If desired, it is also possible to accomplish or strengthen the electrical isolation using an electrically insulating foil (for instance made of Kapton®) which may be arranged as a spacer between the two electrically conductive contact structures. This dielectric foil may then be inserted between the two electrically conductive contact structures prior to the encapsulation process (in particular prior to the molding process), which are consequently electrically decoupled from one another.

A substrate or chip carrier, on which the one or more electronic chips (in particular semiconductor power chips) are mounted (for instance are soldered or sintered), can be connected with electric connection elements such as aluminum ribbons or aluminum wires with a base leadframe constituting the first electrically conductive contact structure. Thereafter, the second electrically conductive contact structure, in particular a second leadframe, may be connected to this arrangement and may be contacted with the chip carrier by further electric connection elements, for instance aluminum ribbons. The mentioned ribbon or wire connections can alternatively also be realized by solder connections, etc.

Subsequently, the constituents of the package may be encapsulated, for instance by a mold compound. At the end of the manufacturing procedure, the manufactured package may be completed by punching portions of one or both of the (for example leadframe-type) electrically conductive contact structures extending beyond the encapsulant. Formed power pins and signal pins may be connected to an electronic periphery device.

Figure 1:
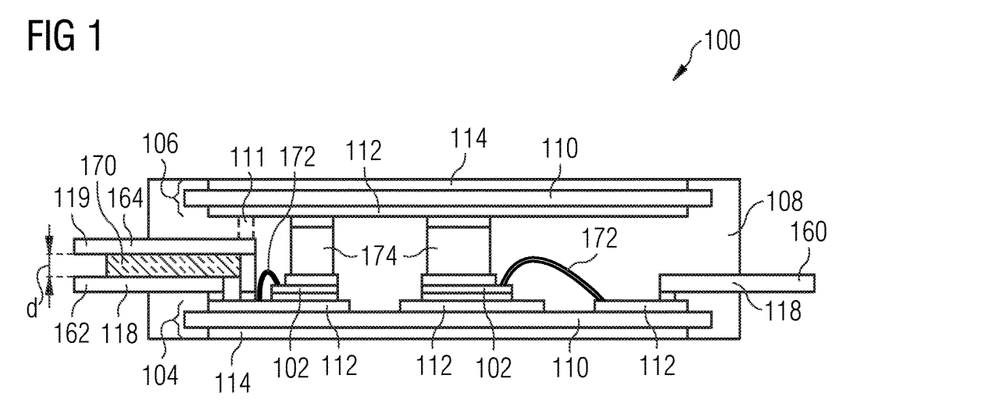
FIG. 1 shows a cross-sectional view of a double-sided cooling package according to an exemplary embodiment.

FIG. 1 shows a cross-sectional view of a double-sided cooling package 100 according to an exemplary embodiment.

The package 100 according to FIG. 1 comprises two electronic chips 102 which are here embodied as power semiconductor chips. The electronic chip 102 shown on the left hand side of FIG. 1 may be a diode chip, whereas the electronic chip 102 shown on the right-hand side of FIG. 1 may be an IGBT (Insulated Gate Bipolar Transistor) chip.

A first heat removal body 104 forming a chip carrier and being embodied as Direct Copper Bonding (DCB) substrate, is thermally and mechanically coupled to a first main surface of the electronic chips 102 and forms part of an exterior surface of the package 100. The first heat removal body 104 is configured for removing thermal energy from the electronic chips 102 during operation of the package 100 to a package external cooling body and/or cooling fluid (not shown). The first heat removal body 104 comprises a central electrically insulating and thermally conductive layer 110, here made of ceramic material such as aluminum oxide or aluminum nitride, having a first main surface covered by a first electrically conductive layer 112, which is here embodied as a patterned copper layer, and having an opposing second main surface covered by a second electrically conductive layer 114, which is here embodied as a continuous copper layer. The electronic chips 102 are mounted and soldered on the first heat removal body 104 and are electrically connected with the first electrically conductive layer 112 by bond wires or bond ribbons as electric connection elements 172. More precisely, the electric connection elements 172 may electrically connect the first heat removal body 104 with a first electrically conductive contact structure 118 and a second electrically conductive contact structure 119. Hence, the first heat removal body 104 functions as a chip carrier and as a heat sink. The second electrically conductive layer 114 of the first heat removal body 104 forms part of an exterior surface of the package 100 and thereby significantly contributes to the heat removal from the electronic chips 102 during operation of the package 100.

Optional spacer bodies 174, which may be embodied as copper blocks, are soldered onto upper main surfaces of the electronic chips 102.

Moreover, a second heat removal body 106 is thermally coupled to a second main surface of the electronic chips 102 via the spacer bodies 174. Also the second heat removal body 106 comprises a central electrically insulating and thermally conductive layer 110, which may be made of a ceramic such as silicon nitride, having a first main surface covered by a first electrically conductive layer 112, which is here embodied as a copper layer, and having an opposing second main surface covered by a second electrically conductive layer 114, which is here embodied as a further copper layer. The first electrically conductive layer 112 of the second heat removal body 106 is soldered onto the spacer bodies 174. The second electrically conductive layer 114 of the second heat removal body 106 forms part of an exterior surface of the package 100 and thereby significantly contributes to the heat removal from the electronic chips 102 during operation of the package 100. As a whole, the second heat removal body 106 is configured as a heat sink for removing thermal energy from the electronic chips 102.

First electrically conductive contact structure 118, here embodied as a leadframe, extends partially within and partially outside of the encapsulant 108 and is electrically coupled with the electronic chips 102 via a solder connection with the patterned first electrically conductive layer 112 of the chip carrier 104 and via the bond wires 172. Correspondingly, a second electrically conductive contact structure 119, here embodied as a further leadframe, extends partially within and partially outside of the encapsulant 108 and is electrically coupled with the electronic chips 102 via a solder connection with the patterned first electrically conductive layer 112 of the chip carrier 104 and via the bond wires 172.

Furthermore, the package 100 comprises a mold-type encapsulant 108 encapsulating the electronic chips 102, the spacer bodies 174, only part of the first electrically conductive contact structure 118, only part of the second electrically conductive contact structure 119, only part of the first heat removal body 104 and only part of the second heat removal body 106. The part of the first electrically conductive contact structure 118 encapsulated by the encapsulant 108 serves for electrically contacting the electronic chips 102, whereas another part of the first electrically conductive contact structure 118 exposed from the encapsulant 108 provides one or more leads or pins for connection with an electronic periphery device (not shown). Correspondingly, the part of the second electrically conductive contact structure 119 encapsulated by the encapsulant 108 serves for electrically contacting the electronic chips 102, whereas another part of the second electrically conductive contact structure 119 exposed from the encapsulant 108 provides one or more leads or pins for connection with the electronic periphery device. Since the first electrically conductive contact structure 118 and the second electrically conductive contact structure 119 extend partially within and partially outside of the encapsulant 108 and are electrically coupled with the electronic chips 102, they are capable of providing an electric coupling between an exterior and an interior of the package 100.

Due to the provision of the first heat removal body 104 and the second heat removal body 106, the package 100 is configured for double-sided cooling. In other words, the two electronic chips 102 are connected to the two heat removal bodies or chip carriers 104, 106 so that thermal energy is removable from two opposing main surfaces of the package 100. Thus, the cooling efficiency of the package 100 is very high.

More specifically, the first electrically conductive contact structure 118 is electrically coupled with one or more first terminals (such as pads) of the electronic chips 102. Correspondingly, the second electrically conductive contact structure 119 is electrically coupled with one or more second terminals (such as pads) of the electronic chips 102. The second electrically conductive contact structure 119 may be a further leadframe or may form part of the same leadframe as the first electrically conductive contact structure 118. Advantageously, a portion of the first electrically conductive contact structure 118 and a portion of the second electrically conductive contact structure 119 are spaced in a vertical direction between two opposing main surfaces of the package 100 by a distance d. As can be taken from FIG. 1 as well, the first electrically conductive contact structure 118 comprises signal pins 160 and a first supply pin 162. The second electrically conductive contact structure 119 comprises a second supply pin 164. The signal pins 160 are configured for carrying electric signals generated and/or processed by the package 100. The first supply pin 162 and the second supply pin 164 are configured for carrying an electric supply signal, such as a supply voltage, which may be used for powering the package 100. The first supply pin 162 and the second supply pin 164 extend, in particular within the encapsulant 108, partly in different planes between the two opposing main surfaces of the package 100, thereby keeping a parasitic inductance formed by the electrically conductive contact structures 118, 119 small.

The signal pins 160 extend out of the encapsulant 108 on a right-hand side of FIG. 1 and continue to extend from the left hand side towards the right hand side outside of the encapsulant 108. Thus, they extend along a first direction which corresponds to the positive horizontal direction according to FIG. 1. In contrast to this, the first supply pin 162 and the second supply pin 164 extend out of the encapsulant 108 on a left-hand side of FIG. 1 and continue to extend from the right-hand side towards the left hand side outside of the encapsulant 108. Thus, the supply pins 162, 164 extend along a second direction which corresponds to the negative horizontal direction according to FIG. 1. The extension directions of the supply pins 162, 164 on the one hand and the signal pins 160 on the other hand outside of the encapsulant 108 are therefore antiparallel.

FIG. 1 furthermore shows that the package 100 additionally comprises a dielectric foil 170, for instance made of polyimide, which is sandwiched between and spaces portions of the first electrically conductive contact structure 118 and of the second electrically conductive contact structure 119. Consequently, the dielectric foil 170 reliably electrically decouples the first electrically conductive contact structure 118 from the second electrically conductive contact structure 119.

Vertical distance, d, between the portions of the first electrically conductive contact structure 118 and of the second electrically conductive contact structure 119 within the encapsulant 108 may be 250 µm. In the embodiment of FIG. 1, the vertical distance, d, is identical to a thickness of the dielectric foil 170.

By guiding the first electrically conductive contact structure 118 and the second electrically conductive contact structure 119 in parallel and vertically spaced between the two opposing main surfaces of the package 100 out of the encapsulant 108, the inductance involved with the electrically conductive contact structures 118, 119 is significantly reduced as compared to a configuration in which their leads are guided out coplanar and juxtaposed to one another. Consequently, electric losses during switching the package 100 (which may be embodied as an inverter) with a high velocity or frequency, may be small. At the same time, heat generated during operation of the package 100 and originating from the power semiconductor chips 102 can be guided out of the package 100 via the opposing main surfaces of the package 100 defined by the heat removal bodies 104, 106, i.e. by double-sided cooling. This additionally improves the reliability of the package 100 and prevents undesired delamination as a result of thermal load.

As can be taken from reference numeral 111 in FIG. 1, it is alternatively also possible that the second electrically conductive contact structure 119 is connected to the second heat removal body 106 rather than to the first heat removal body 104. More precisely, one embodiment may connect both the first electrically conductive contact structure 118 and the second electrically conductive contact structure 119 to the first heat removal body 104 (embodied as bottom DCB). In another embodiment, one of the first electrically conductive contact structure 118 and the second electrically conductive contact structure 119 may be connected to the first heat removal body 104, whereas the respectively other one of the first electrically conductive contact structure 118 and the second electrically conductive contact structure 119 may be connected to the second heat removal body 106 (embodied as top DCB).

Figure 2:
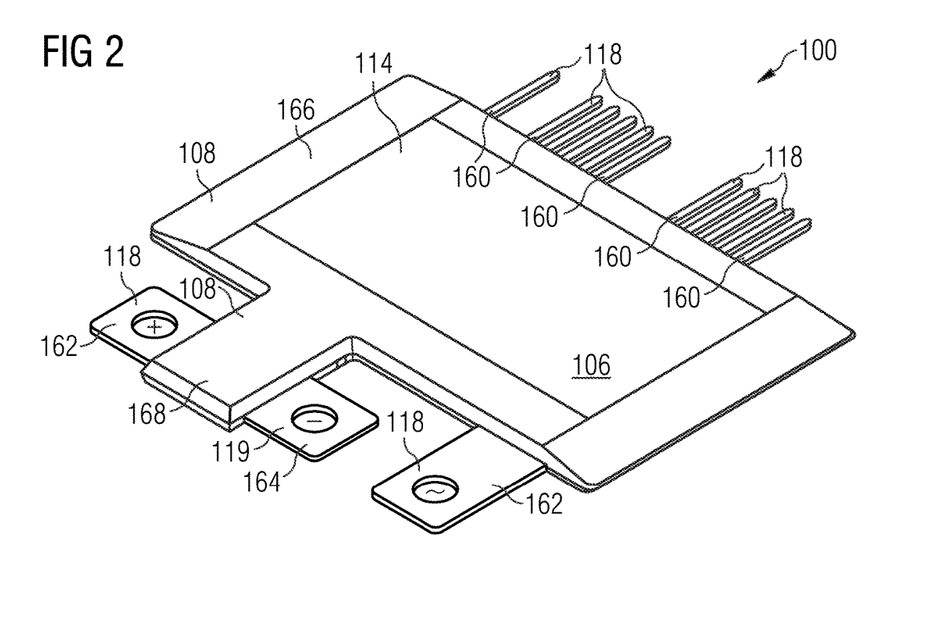
FIG. 2 shows a three-dimensional view of a power package according to another exemplary embodiment.

FIG. 2 shows a three-dimensional view of a power package 100 according to another exemplary embodiment. FIG. 3 shows a three-dimensional view of an interior of the power package 100 according to FIG. 2.

As can be taken from a comparison of FIG. 2 with FIG. 3, part of the first electrically conductive contact structure 118 and part of the second electrically conductive contact structure 119 are vertically spaced and electrically decoupled from one another in an interior of the encapsulant 108. At the same time, another part of the first electrically conductive contact structure 118 and another part of the second electrically conductive contact structure 119 outside of the encapsulant 108 are coplanar, i.e. are arranged within the same plane. Moreover, portions of the first electrically conductive contact structure 118 and of the second electrically conductive contact structure 119 within the encapsulant 108 are strip-shaped structures with a rectangular cross-section. Still referring to FIG. 2 and FIG. 3, the first electrically conductive contact structure 118 is planar, whereas the second electrically conductive contact structure 119 has different sections extending in different planes and being integrally connected by a vertical step. A first portion of the second electrically conductive contact structure 119 is coplanar with the first electrically conductive contact structure 118, wherein as a second portion of the second electrically conductive contact structure 119 extends in a plane parallel to another plane in which the first electrically conductive contact structure 118 extends.

In the shown embodiment, one of the two first supply pins 162 comprises a positive potential pin (see "+" sign in FIG. 2), and the second supply pin 164 comprises a negative potential pin (see "−" sign in FIG. 2). Another one of the first supply pins 162 comprises a phase pin (see "−" sign in FIG. 2). The latter mentioned first supply pin 162 extends in the same plane as the positive potential pin. In contrast to this, the second supply pin 164 only partly extends in the same plane as the first supply pins 162 (more precisely the second supply pin's 164 part outside of the encapsulant 108) and partially extends in another plane parallel to the before mentioned plane (more precisely the second supply pin's 164 part within the encapsulant 108).

In the shown embodiment which relates to a half bridge, there is only one phase pin. However, in another embodiment in which a package 100 is configured as an H bridge, there can be two phase pins. In yet another embodiment in which the package 100 is configured as a full bridge, there can be three phase pins. Such one or more phase pins can be connected to an engine of a vehicle in which the package 100 is implemented (compare FIG. 8). In contrast to this, the positive potential pin and the negative potential pin may be connected to a battery of such a vehicle.

As can be taken from FIG. 2 and FIG. 3, the needle-like signal pins 160 have a smaller dimension than the strip-shaped supply pins 162, 164 (which also have a central through hole in end portions).

As can be seen in FIG. 2, the encapsulant 108 comprises a bulky main body 166 (in which the chips 102 and the heat removal bodies 104, 106 are embedded) and a protrusion-like extension 168 being narrower than the main body 166. Both the first electrically conductive contact structure 118 and the second electrically conductive contact structure 119 extend partly through the extension 168 with a vertical gap in between and are electrically decoupled from one another by electrically insulating material of the extension 168 (see FIG. 3 in comparison with FIG. 2). In contrast to this, an exposed end portion of the second electrically conductive contact structure 119 extends in the same plane as an exposed end portion of the first electrically conductive contact structure 118 (see FIG. 2). When the exposed end portions of both the first electrically conductive contact structure 118 and the second electrically conductive contact structure 119 are coplanar, they can be clamped by a mold tool during encapsulation in a particularly simple way.

As can be taken from FIG. 2, the signal pins 160 are coplanar. However, in another embodiment, it is also possible that the signal pins 160 lie in different planes, for instance in two parallel planes.

FIG. 2 shows that the external appearance, geometry and position of the supply pins 162, 164 is coplanar and therefore does not differ compared to conventional architectures. However, as can be taken from FIG. 3 showing package 100 without encapsulant 108 for the sake of clarity, the interior structure of the package 100 involves a configuration of the second electrically conductive contact structure 119 with a first portion being connected via the electric connection elements 172 to the chip carrier 104 and extending within the same plane until leaving the extension 168. This plane is vertically displaced with regard to another lower plane within which the entire first electrically conductive contact structure 118 is located. A second portion of the second electrically conductive contact structure 119 is connected with the first portion via a vertical step by which the externally appearing second supply pin 164 is guided back and downwardly into the plane within which the entire first electrically conductive contact structure 118 extends. Therefore, the position of the supply pins 162, 164 is coplanar and compatible with conventional periphery devices, wherein the second electrically conductive contact structure 119 in an interior of the extension 168 accomplishes the low inductance configuration. By guiding the supply pins 162, 164 out of a lateral surface of the encapsulant 108 opposing another side surface of the encapsulant 108 through which the signal pins 160 are guided out of the encapsulant 108, the provided space is efficiently used and an undesired electrical interference between supply pins 162, 164 and signal pins 160 can be avoided. This architecture also contributes to a compact design of the package 100.

As can furthermore be taken from FIG. 3, the fact that the signal pins 160 have a smaller lateral extension than the supply pins 162, 164 is reflected in the fact that the signal pins 160 are electrically coupled with the chip carrier 104 via bond wires as electric connection elements 172, whereas the larger first and second supply pins 162, 164 are electrically connected via ribbons as electric connection elements 172.

Referring to FIG. 3, it should be said that, as an alternative to the provision of electric connection elements 172, it would also be possible to integrate the signal pins 160 with the first heat removal body 104. This integral formation has the advantage of a simplified manufacturability. The provision of electric connection elements 172 has the advantage of a proper mechanical decoupling between DCB and leadframe. Correspondingly, as an alternative to the provision of electric connection elements 172, it would also be possible to integrate the supply pins 162 and/or 164 with the first heat removal body 104.

FIG. 4 to FIG. 7 show plan views of structures obtained during manufacturing a power package 100 according to an exemplary embodiment.

Figure 4:
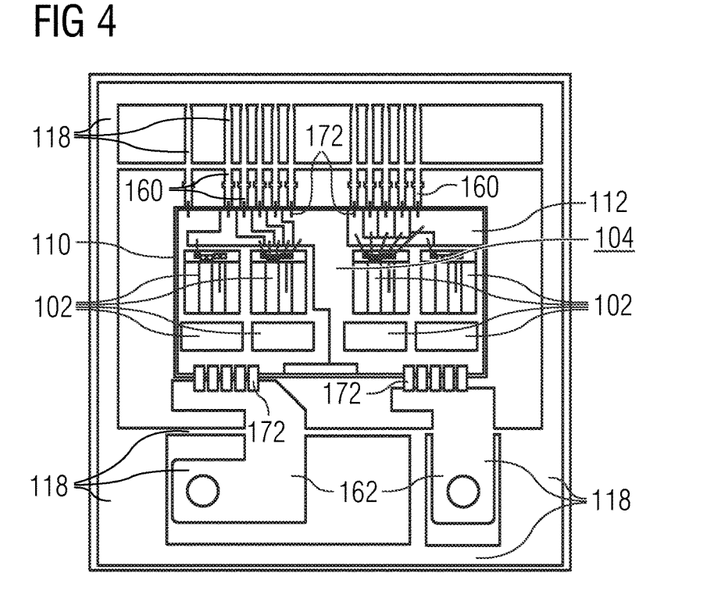
FIG. 4 to FIG. 7 show plan views of structures obtained during manufacturing a power package according to an exemplary embodiment.

FIG. 4 shows that a leadframe constituting the first electrically conductive contact structure 118 and having a central recess is arranged around the first heat removal body 104 with the electronic chips 102 mounted thereon. It can furthermore be taken from FIG. 4, that broad ribbons and tiny narrow bond wires are used as electric connection elements 172 for electrically contacting leads of the leadframe with the first heat removal body 104 which is, in turn, electrically coupled with the electronic chips 102.

Figure 5:
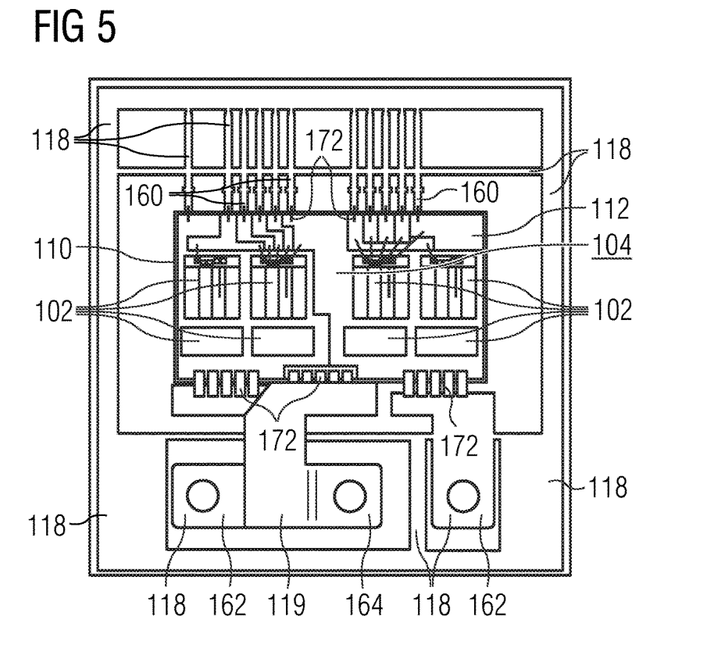

FIG. 5 shows how subsequently the (here also leadframe-type) second electrically conductive contact structure 119 is mounted on the arrangement shown in FIG. 4 for providing the further second supply pin 164. Again, the second electrically conductive contact structure 119 may be coupled with the first heat removal body 104 via additional broad ribbons as further electric contact elements 172.

Figure 6:
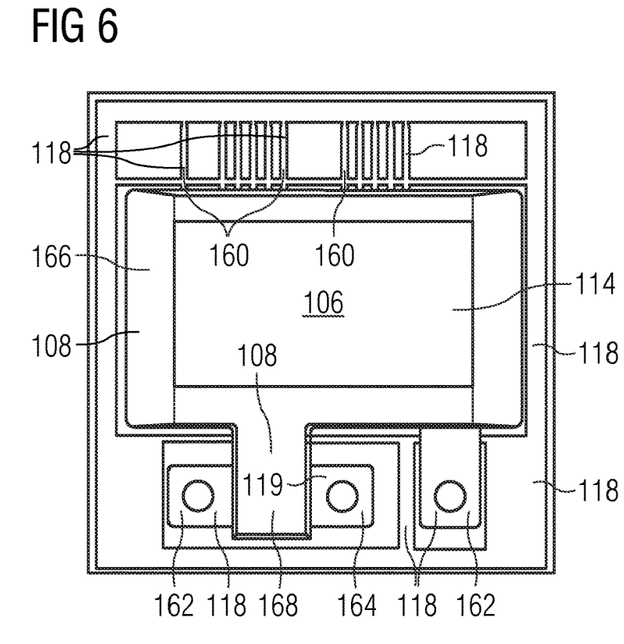

FIG. 6 shows that the structure shown in FIG. 5 is subsequently encapsulated using a mold tool (not shown). As a consequence, encapsulant 108 is formed with main body 166 and extension 168. The extension 168 contributes to a reliable decoupling of the portions of the electrically conductive contact structures 118, 119 being located in parallel vertically spaced planes. Before the encapsulating, the second heat removal body 106 is placed on or above the electronic chips 102.

Figure 7:
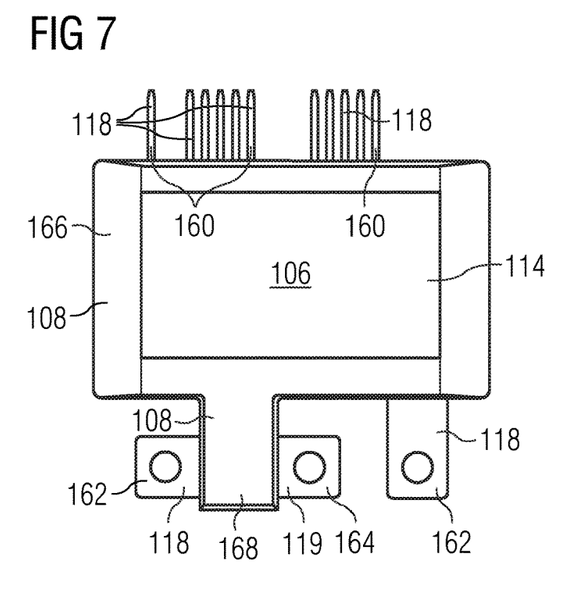

In order to obtain the structure in FIG. 7, circumferential portions of the leadframe constituting the first electrically conductive contact structure 118 are then separated from the readily manufactured package 100, for instance by punching.

Figure 8:
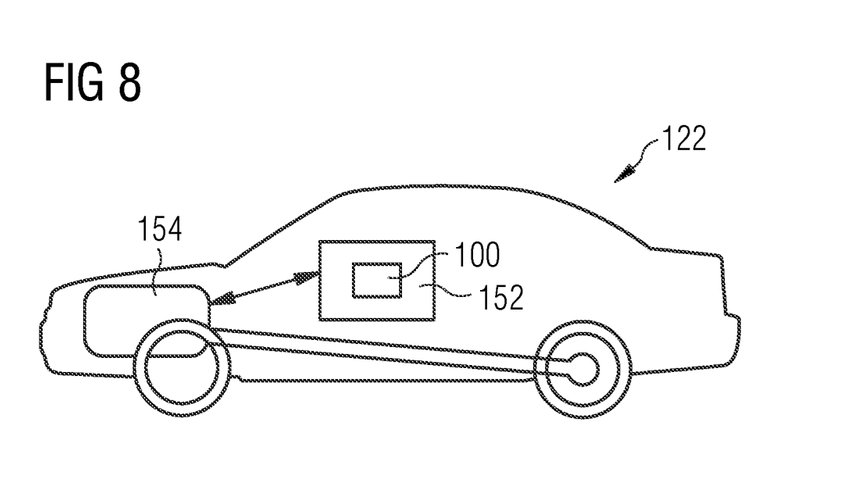
FIG. 8 shows a schematic view of a vehicle with a package according to an exemplary embodiment.

FIG. 8 shows a schematic view of a vehicle 122 with a package 100 according to an exemplary embodiment.

More specifically, the power package 100 may form part of a control block 152 controlling operation of engine/battery block 154. Hence, a package 100 or power module according to an exemplary embodiment of the invention may be used for an automotive application. A preferred application of such a power package 100 is an implementation as an inverter circuit or inverted rectifier for vehicle 122 which may be an electrically driven vehicle or which may be a hybrid vehicle. Such an inverter may transfer a direct current (DC) of the battery into an alternating current (AC) for driving the electric engine of vehicle 122. In a hybrid vehicle, it is also possible to at least partially recover mechanical energy and to transfer it, by the inverter, back into electric energy to recharge the battery. In such an automotive inverter application, extreme amounts of heat are generated during operation of the power package 100. This heat can be efficiently removed by the double-sided cooling concept described above. However, it should be said that, in other embodiments, also single-sided cooling may be sufficient.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, comprising:
   at least one electronic chip;
   an encapsulant encapsulating at least part of the at least one electronic chip;
   a first electrically conductive contact structure extending partially within and partially outside of the encapsulant and being electrically coupled with at least one first terminal of at least one of the at least one electronic chip;
   a second electrically conductive contact structure extending partially within and partially outside of the encapsulant and being electrically coupled with at least one second terminal of at least one of the at least one electronic chip;
   a first heat removal body thermally coupled to a first main surface of the at least one electronic chip and configured for removing thermal energy from the at least one electronic chip;
   wherein at least a portion of the first electrically conductive contact structure within the encapsulant and at least a portion of the second electrically conductive contact structure within the encapsulant are spaced in a direction between two opposing main surfaces of the package; and wherein both the first electrically conductive contact structure and the second electrically conductive contact structure are connected to the first heat removal body.

2. The package according to claim 1, wherein the first electrically conductive contact structure comprises at least one first supply pin, in particular comprises at least one signal pin and the at least one first supply pin.

3. The package according to claim 2, wherein the second electrically conductive contact structure comprises at least one second supply pin.

4. The package according to claim 3, wherein the at least one first supply pin and the at least one second supply pin extend at least partly in different planes between the two opposing main surfaces of the package.

5. The package according to claim 3, wherein the at least one first supply pin comprises a positive potential pin and the at least one second supply pin comprises a negative potential pin.

6. The package according to claim 2, wherein the at least one first supply pin comprises a phase pin, in particular extending in the same plane as the positive potential pin.

7. The package according to claim 2, wherein the at least one signal pin has a smaller dimension, in particular cross-sectional area, than the at least one first supply pin.

8. The package according to claim 2, wherein the at least one signal pin extends out of the encapsulant along a first direction differing from, in particular opposing, a second direction along which the at least one first supply pin extends out of the encapsulant.

9. The package according to claim 1, wherein at least a portion of the first electrically conductive contact structure and at least a portion of the second electrically conductive contact structure extend parallel to one another.

10. The package according to claim 1, wherein the encapsulant comprises a main body and an extension being narrower than the main body, wherein the first electrically conductive contact structure and the second electrically conductive contact structure extend partly through the extension, and are in particular electrically decoupled from one another by electrically insulating material of the extension.

11. The package according to claim 1, comprising a dielectric layer, in particular a dielectric foil, between a portion of the first electrically conductive contact structure and a portion of the second electrically conductive contact structure and electrically decoupling the first electrically conductive contact structure and the second electrically conductive contact structure from one another.

12. The package according to claim 1, wherein at least one other portion, in particular an exposed portion outside of the encapsulant, of the second electrically conductive contact structure extends in the same plane as at least one other portion, in particular an exposed portion outside of the encapsulant, of the first electrically conductive contact structure.

13. The package according to claim 1, wherein the encapsulant encapsulates part of the first heat removal body.

14. The package according to claim 13, comprising a second heat removal body thermally coupled to a second main surface of the at least one electronic chip or of at least one further electronic chip and configured for removing thermal energy from the at least one electronic chip or of the at least one further electronic chip, wherein the encapsulant encapsulates part of the second heat removal body.

15. The package according to claim 1, wherein at least one of the first electrically conductive contact structure and the second electrically conductive contact structure is a leadframe.

16. The package according to claim 1, wherein at least one of the first electrically conductive contact structure and of the second electrically conductive contact structure comprises at least one strip-shaped pin, in particular having a rectangular cross section.

17. The package according to claim 1, wherein a vertical distance between the portion of the first electrically conductive contact structure within the encapsulant and the portion of the second electrically conductive contact structure within the encapsulant is less than 1000 μm, in particular is in a range between 100 μm and 400 μm, more particularly is in a range between 200 μm and 300 μm.

18. The package according to claim 1, wherein the first electrically conductive contact structure is entirely planar.

19. The package according to claim 1, wherein the second electrically conductive contact structure has different planar sections extending in different planes.

20. The package according to claim 1, wherein at least one of the first electrically conductive contact structure and the second electrically conductive contact structure extends out of the encapsulant at a lateral surface of the package between the two opposing main surfaces.

21. A power package, comprising:
a plurality of semiconductor power chips;
an encapsulant encapsulating at least part of each of the plurality of semiconductor power chips;
a first electrically conductive contact structure extending partially within and partially outside of the encapsulant and being electrically coupled with at least one first terminal of at least one of the plurality of semiconductor power chips;
a second electrically conductive contact structure extending partially within and partially outside of the encapsulant and being electrically coupled with at least one second terminal of at least one of the plurality of semiconductor power chips;
a first heat removal body thermally coupled to a first main surface of the at least one electronic chip and configured for removing thermal energy from the at least one electronic chip;
wherein at least a portion of the first electrically conductive contact structure and at least a portion of the second electrically conductive contact structure are vertically spaced and electrically decoupled from one another; and
wherein both the first electrically conductive contact structure and the second electrically conductive contact structure are connected to the first heat removal body.

22. A vehicle, comprising a package according to claim 1.

23. A method of manufacturing a package, wherein the method comprises:
encapsulating at least part of at least one electronic chip with an encapsulant;
providing a first electrically conductive contact structure extending partially within and partially outside of the encapsulant and being electrically coupled with at least one first terminal of at least one of the at least one electronic chip;
providing a second electrically conductive contact structure extending partially within and partially outside of the encapsulant and being electrically coupled with at least one second terminal of at least one of the at least one electronic chip;

providing a first heat removal body thermally coupled to a first main surface of the at least one electronic chip and configured for removing thermal energy from the at least one electronic chip;

spacing at least a portion of the first electrically conductive contact structure and at least a portion of the second electrically conductive contact structure from one another within the encapsulant and in a direction extending between two opposing main surfaces of the package;

wherein both the first electrically conductive contact structure and the second electrically conductive contact structure are connected to the first heat removal body.

24. A method of manufacturing a power package, wherein the method comprises:

encapsulating at least part of each of a plurality of semiconductor power chips by an encapsulant;

providing a first electrically conductive contact structure extending partially within and partially outside of the encapsulant and being electrically coupled with at least one first terminal of at least one of the plurality of semiconductor power chips;

providing a second electrically conductive contact structure extending partially within and partially outside of the encapsulant and being electrically coupled with at least one second terminal of at least one of the plurality of semiconductor power chips;

providing a first heat removal body thermally coupled to a first main surface of the at least one electronic chip and configured for removing thermal energy from the at least one electronic chip;

electrically decoupling the first electrically conductive contact structure from the second electrically conductive contact structure by vertically spacing at least portions of the first electrically conductive contact structure and the second electrically conductive contact structure within the encapsulant;

wherein both the first electrically conductive contact structure and the second electrically conductive contact structure are connected to the first heat removal body.

25. A method of using a package according to claim 1 for an automotive application, in particular as an inverter circuit for an at least partially electrically driven vehicle.

* * * * *